United States Patent [19]
Mangelsdorf et al.

[11] Patent Number: 4,596,976
[45] Date of Patent: Jun. 24, 1986

[54] INTEGRATED CIRCUIT ANALOG-TO-DIGITAL CONVERTER

[75] Inventors: Christopher W. Mangelsdorf, Cambridge, Mass.; Adrian P. Brokaw, Limerick, Ireland

[73] Assignee: Analog Devices, Incorporated, Norwood, Mass.

[21] Appl. No.: 615,306

[22] Filed: May 30, 1984

[51] Int. Cl.[4] ............... H03K 5/153; H03M 1/12
[52] U.S. Cl. ............... 340/347 AD; 307/361
[58] Field of Search ............... 340/347 AD; 307/361

[56] References Cited

U.S. PATENT DOCUMENTS

| | | | |
|---|---|---|---|
| 3,794,892 | 2/1974 | Preston | 340/347 M |
| 4,225,854 | 9/1980 | Davis et al. | 340/347 AD |
| 4,270,118 | 5/1981 | Brokaw | 340/347 AD |
| 4,475,169 | 10/1984 | Gilbert | 364/817 |

Primary Examiner—L. T. Hix
Assistant Examiner—David M. Gray
Attorney, Agent, or Firm—Parmelee, Bollinger & Bramblett

[57] ABSTRACT

An analog-to-digital converter in the form of an integrated circuit providing a plurality of parallel-connected sub-converters, each producing one bit of the output word. For any sub-converter, an elongate P-type diffusion (20) serves as the base of a multiple-emitter NPN transistor. The same diffusion (20) serves as the collector of a pair of lateral PNP transistors. The lateral transistors inject current into the central diffusion, resulting in a parabolic voltage distribution along its length. A differential analog input voltage applied to the ends of the central diffusion shifts the parabolic voltage peak longitudinally along the diffusion. The multiple emitters of the NPN transistor are connected alternately to output nodes and sense the position of the parabolic voltage peak to produce the binary output.

17 Claims, 16 Drawing Figures

Fig. 1.
(PRIOR ART)

SUB-CONVERTERS
BIT-SLICE A/D ARCHITECTURE

Fig. 2.
(PRIOR ART)

FOUR-BIT GRAY CODE

DISTRIBUTED CURRENT SOURCE BIAS

Fig. 11.
OUTPUT OF A TYPICAL NINE EMITTER DEVICE

Fig. 12.
OUTPUT OF A TYPICAL FIVE EMITTER DEVICE

Fig. 13. 
GRAY CODE PATTERN OF "ON" BITS

INTEGRATED CIRCUIT ANALOG-TO-DIGITAL CONVERTER

BACKGROUND OF THE INVENTION

1. Field of the Invention

This invention relates to analog-to-digital converters of the parallel type.

2. Description of the Prior Art

A conventional parallel analog-to-digital (A/D) converter compares an analog input signal to a set of discrete voltage levels which define voltage intervals. The converter produces a digital output indicative of the voltage interval into which the analog input signal falls. A separate voltage comparator is associated with each reference level to compare the analog input to that level. Hence, for an n bit digital code which can indicate any of $2^n$ voltage intervals defined by $2^n-1$ quantum levels, $2^n-1$ comparators are required.

Another type of parallel A/D converter is shown in U.S. Pat. No. 4,270,118, issued to A. P. Brokaw on May 26, 1981. In that converter, the analog input is compared to $2^n-1$ discrete reference levels in n comparators. Each comparator produces a one-bit binary output the value of which alternates as the analog input signal increases through the discrete reference signal levels. Logic circuitry produces an n-bit code from the comparator outputs.

Figure 1:
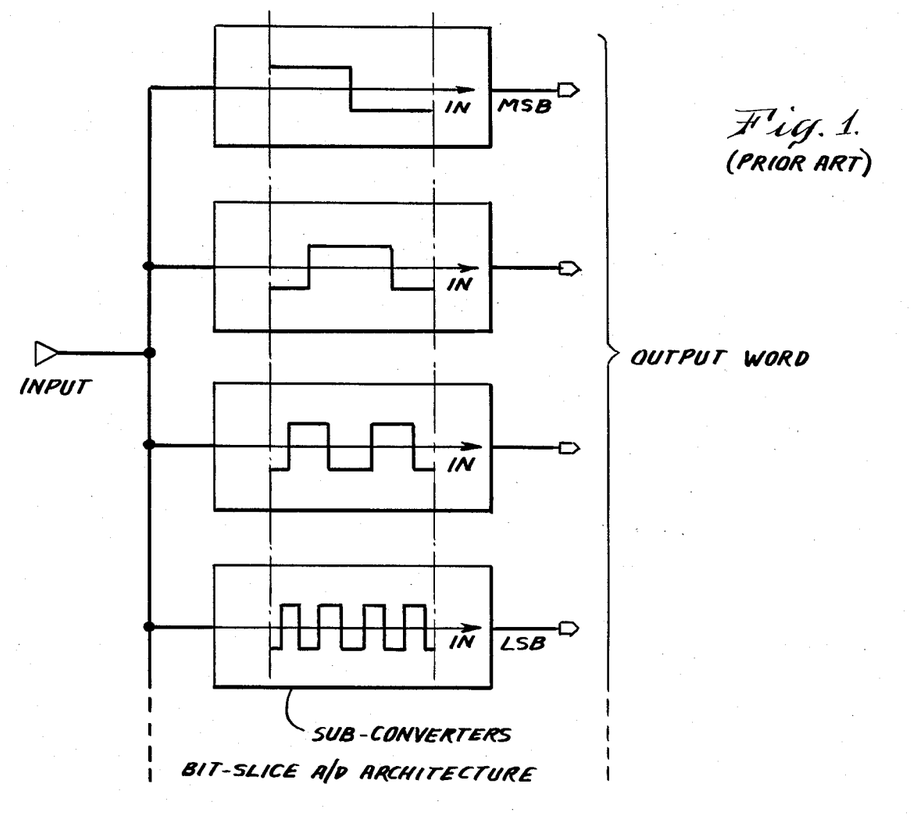
FIG. 1 shows schematically a converter having a bit-slice architecture.

This type of converter can be said to have a "bit slice" architecture. As illustrated schematically in FIG. 1, the input signal in such a converter is applied in parallel to a collection of "sub-converters" each of which creates only a single bit of output representing a particular digit in the output word. FIG. 1 shows symbolically that the output of each of these sub-converters is a periodic function of the input signal with the output toggling back and forth between logic 1 and logic 0 as the input signal is increased from zero to full-scale. The sub-converter for the LSB, for example, must have the smallest "period", that is, the greatest number of 0/1 and 1/0 transitions over the full range. The next highest bit unit will have a "period" which is twice as great as the LSB's "period", and so forth.

Compared to the usual A/D converters, this "bit-slice" type of converter has several distinct advantages. It provides a true "parallel process", in that low-order bit decisions do not have to wait for high-order bits to finish conversion, as in successive approximation or cascaded schemes. Furthermore, high speed is not bought at the cost of extreme replication as in flash converters because only one "sub-converter" is required per bit.

Each bit decision is made without any information on what the state of the other output bits will be. This can lead to large errors if a standard binary-weighted output code is used. To overcome this problem, the standard binary code is replaced with a cyclic or Gray code in which sequential values differ in only one digit. In that way, only one of the "sub-converters" is ever near its threshold for any input, and small errors in the threshold can only result in an error equivalent to the smallest converter increment.

Figure 2:
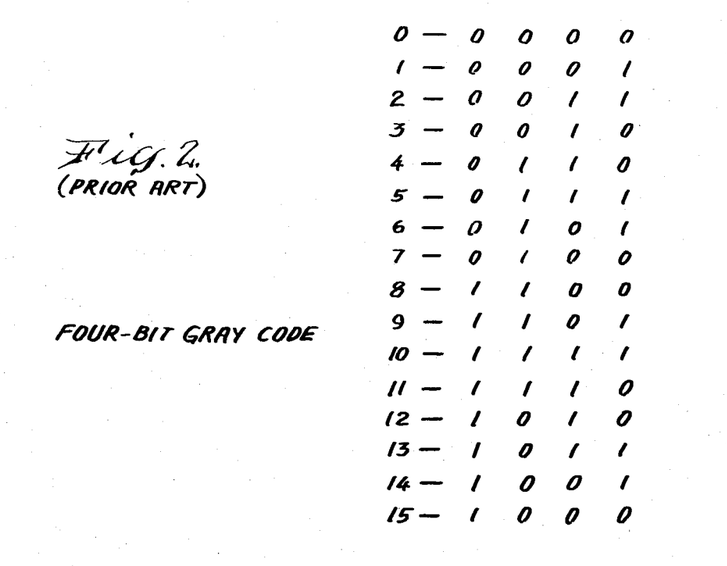
FIG. 2 is a table presenting four bits of a Gray code as used in the disclosed converter.

FIG. 2 lists four bits of the Gray code best suited for an A/D converter output. It is not a weighted code; i.e., each position in the code does not correspond to a particular quantity. However, it is a relatively simple matter to convert this code to a standard binary representation. Also, the regularity of the transitions is advantageous for the A/D converter disclosed herein, as will be apparent from the subsequent description.

In the interest of simplicity, the first bit of the Gray code, the bit that toggles least frequently over the input range, will be referred to as the "MSB" even though it is not the "most significant" in any sense. Similarly, "LSB" will refer to the bit that toggles most frequently.

SUMMARY

The invention utilizes a unique A/D converter structure of the type having a bit-slice architecture as discussed hereinabove. The new structure advantageously provides very high-speed operation, and affords significant improvements in miniaturization. A multi-bit converter of this design can be placed in a single isolation region in an IC chip, and can be made by conventional IC processes.

In one preferred embodiment of the invention, to be described hereinbelow in detail, the analog input signal is transformed into a spatially-shiftable voltage peak by applying that voltage across a long base resistor biased by a distributed current source. This current develops a parabolic voltage profile along the length of the resistor, with the position of the voltage peak being shiftable along the resistor in accordance with the magnitude of the analog input voltage. This shiftable voltage peak controls a set of "sub-converters" each comprising a different-numbered set of emitters spaced along the resistor. The emitters of each sub-converter are interconnected to produce a respective binary output which toggles between 0 and 1 as the parabolic voltage peak moves along the base resistor. In this fashion, the sub-converters produce periodic, functions as shown in FIG. 1.

Details of a suitable circuit for developing a spatially-shiftable voltage peak can be found in U.S. application Ser. No. 344,543, filed by Barrie Gilbert on Feb. 1, 1982, directed to a trigonometric function generator. The inventive embodiment disclosed herein uses a spatially-shiftable voltage peak in an entirely distinctive manner to produce a quite different result.

DESCRIPTION OF A PREFERRED EMBODIMENT

Figure 3:
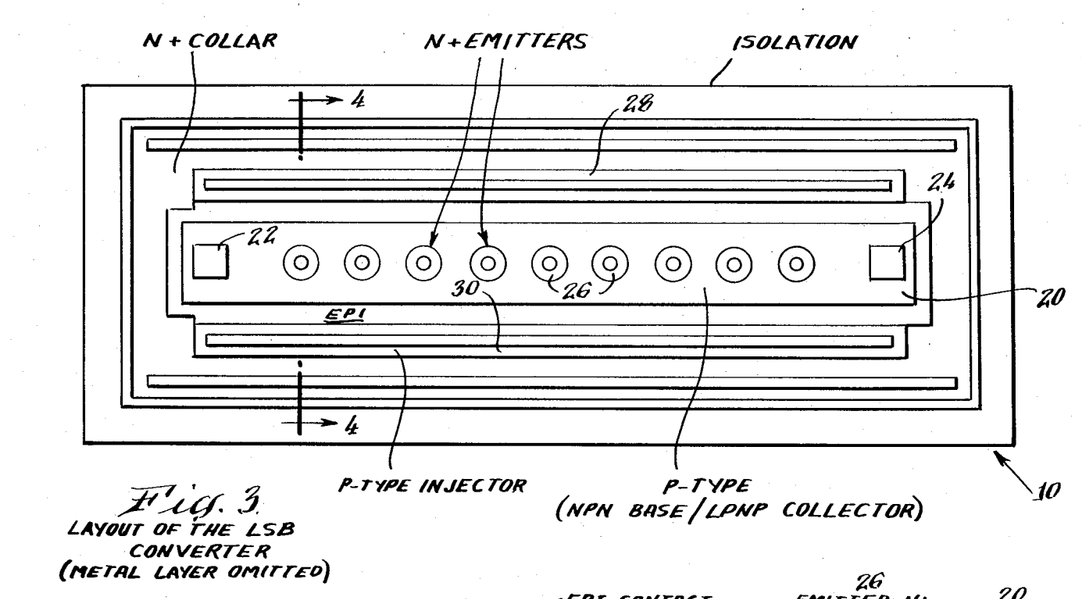
FIG. 3 is a plan view of a least-significant-bit sub-converter for a four-bit converter.
Figure 4:
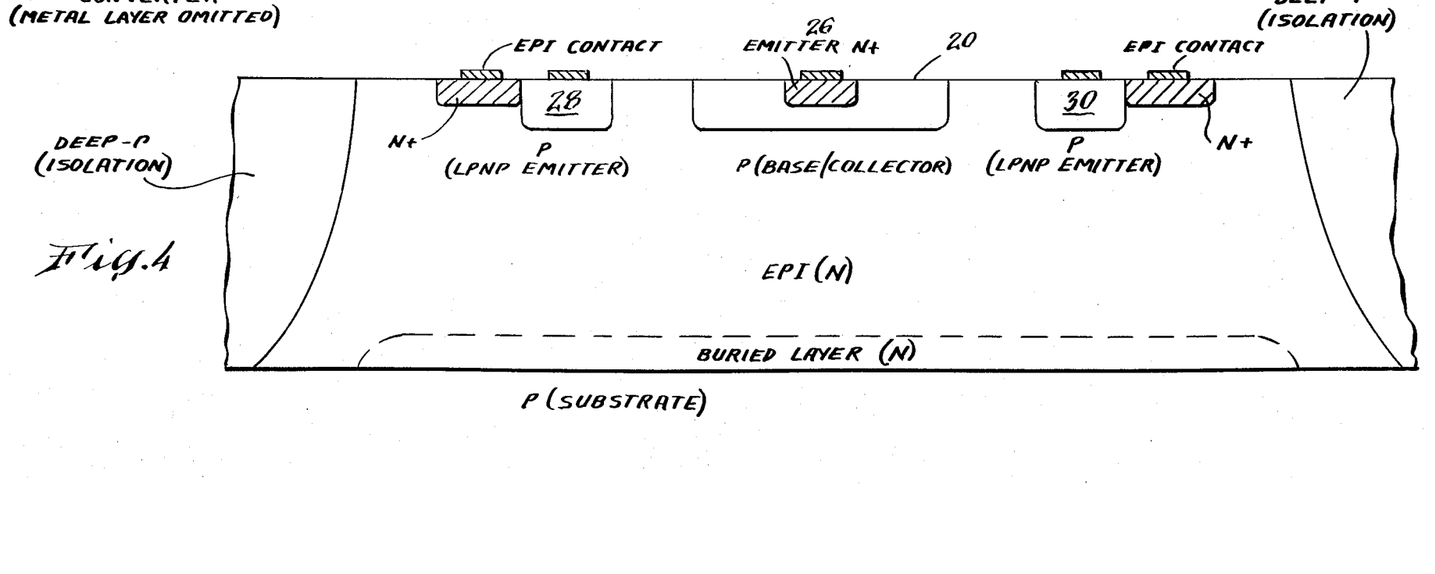
FIG. 4 is a pictorial presentation of an enlarged cross-section taken substantially along the line 4—4 of FIG. 3.
Figure 5:
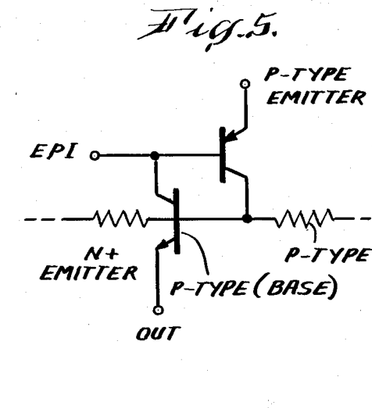
FIG. 5 shows schematically the junction interconnections for the FIG. 3 sub-converter.

Referring now to FIGS. 3 and 4, the core of the new IC converter includes a long P-type diffusion 20 having input terminals 22, 24 at its ends to receive an analog input signal. This diffusion forms the base of a multiple-emitter NPN having emitters 26 spaced along the base diffusion. FIG. 5 is an equivalent-circuit presentation of the junctions.

The base diffusion 20 is biased by a distributed current source formed by P-type diffusions 28, 30 defining lateral PNPs with the P-type diffusion 20 serving in this case as a common collector. That is, the central P diffusion acts as both the collector for the two LPNPs and as the base for the NPNs. Since there are two transistor structures, the NPN and the PNP, some confusion in nomenclature can arise. To minimize this, the terms "emitter", "base" and "collector" will hereinafter always refer to the NPN transistors, unles the LPNP is explicitly identified by the context. "Injector" will be used interchangeably with LPNP.

Figure 6:
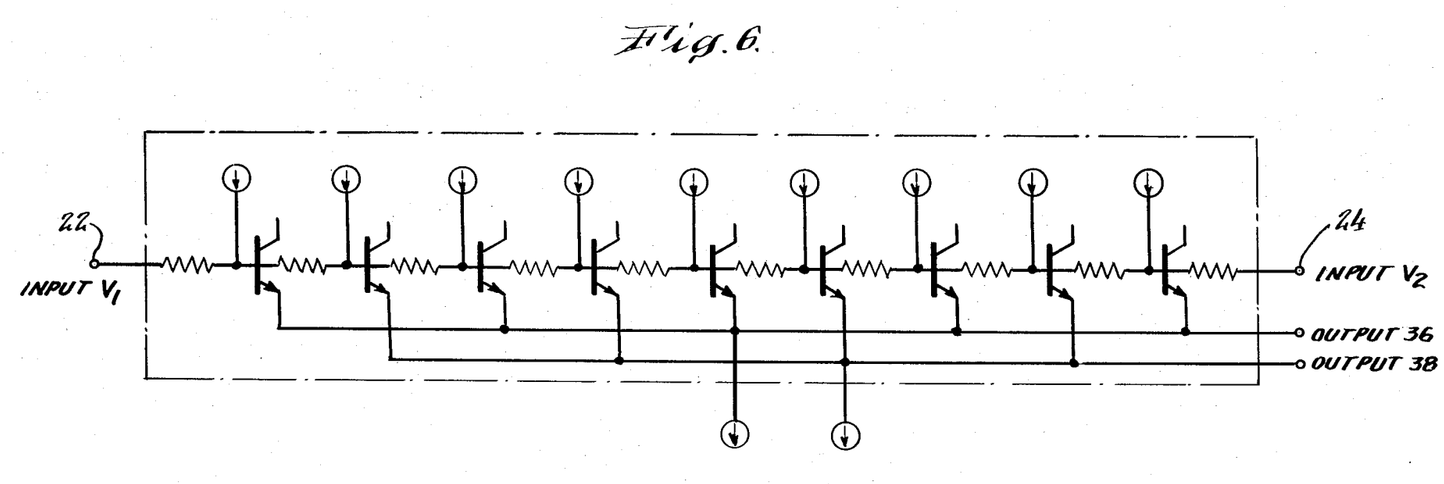
FIG. 6 is a discrete-element equivalent-circuit of the converter of FIG. 3.

Uniformly-distributed LPNP current flow into the base diffusion 20 produces a parabolic voltage profile along its length if the end contacts are held at a fixed potential. The voltage along this diffusion is tapped directly at regular intervals by the local NPNs arranged as two sets of emitter followers. FIG. 6 shows the two sets of emitter followers with each set biased by a respective "tail" current source (located outside of the core shown in FIG. 3).

Figure 7:
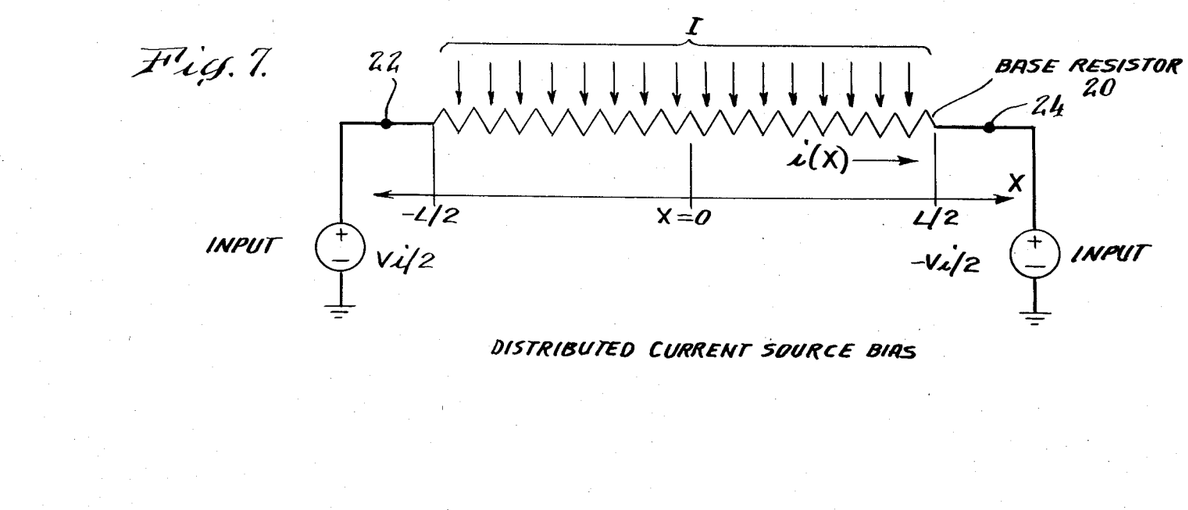
FIG. 7 shows a uniformly-distributed current source biasing a long base resistor.

FIG. 7 illustrates the injection of a uniform current density into the diffusion 20, and shows a differential input voltage applied to the contacts 22, 24 at the ends of the diffusion. The resulting voltage distribution along diffusion 20 is parabolic and the location of its maximum, or peak, is a linear function of the differential input voltage.

Referring again to FIG. 6, the NPNs nearest the parabolic peak potential (i.e., those having the highest base voltages) will pull the common emitter nodes up, reducing the base-emitter voltage of all the other followers. The voltage of any given emitter node will be the highest base voltage of all the followers in the group, less one $V_{be}$. It is the differential voltage developed between the two emitter nodes 36, 38 which is used as the output signal.

Figures 8, 9, 10:
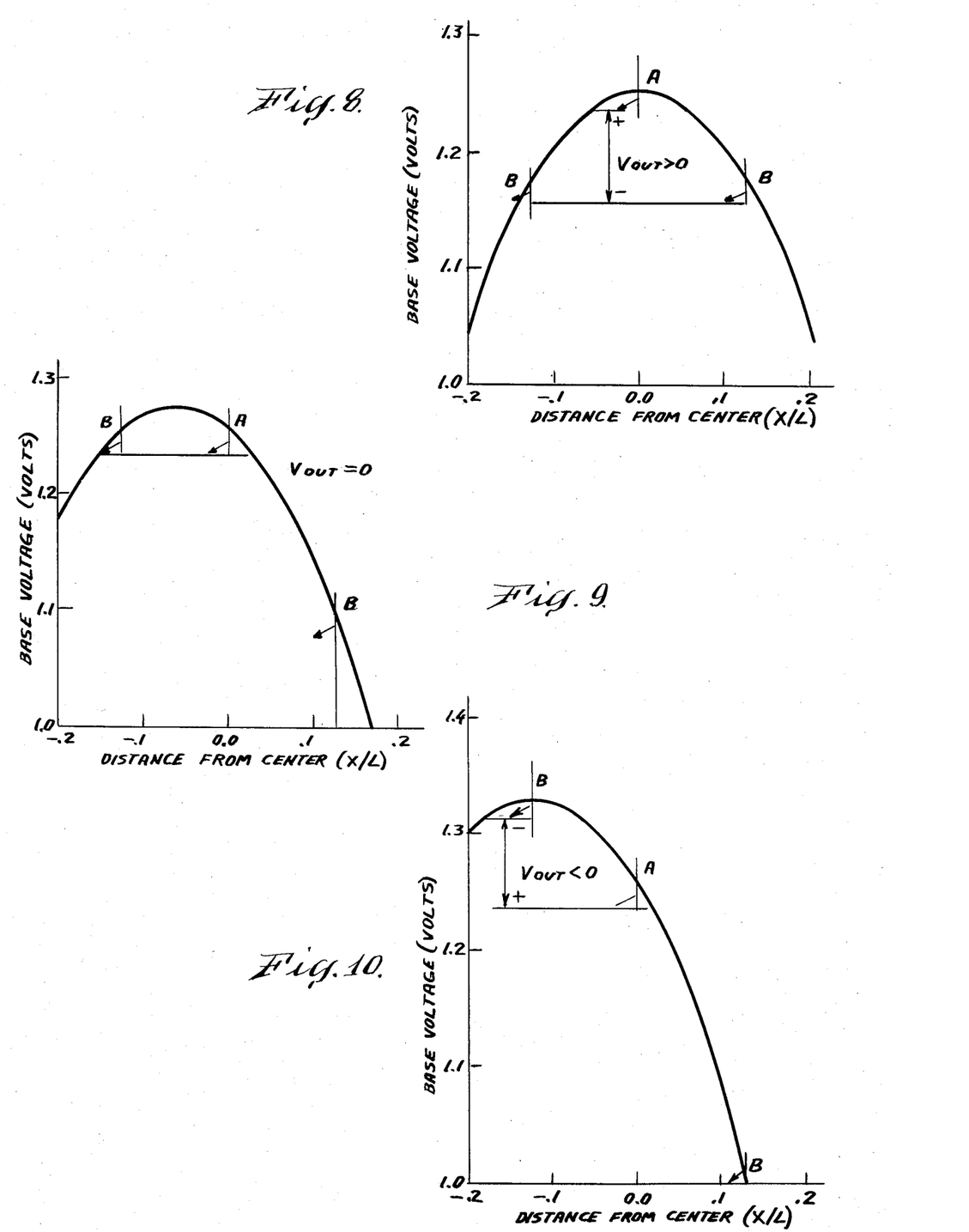
FIGS. 8, 9 and 10 are graphs for explaining operational aspects of a sub-converter.

To see how this arrangement will generate the required periodic output function, assume that the inputs (the ends 22, 24 of the long base resistor 20) are grounded (the analog input is zero), so that the peak of the parabolic peak potential is at the center of the device. This is illustrated by the diagram in FIG. 8. For the purpose of this picture, the discrete current sources of FIG. 6 have been replaced by a distributed source spread over the length of the base, as in FIG. 7, so that the base potential is a smooth parabola. (The change from discrete to distributed current source does not however affect the operation of the device.) Another important point about FIG. 8 is that only the central portion of the base resistor is depicted, and only three of the transistors are included. The symbols superimposed on the plot are intended to indicate the position of the NPNs on the base resistor.

For the balanced input condition represented in FIG. 8, the central transistor, marked "A", will pull up output node 36 to just less than the peak base voltage. Other NPNs connected to that node (not shown) have a lower base voltage and hence are cut off. The two "B" transistors are both connected to the other output node 38, and since they have the same base voltage, they will share the nodal tail current. Again, any other transistors of that set are cut off. The output, indicated as positive, is the difference between the base voltages of the "A" and "B" NPNs less 18 mV at room temperature (to account for the difference in current density).

As a differential input signal is applied to the ends of the base, the potential peak moves away from the center NPN toward one of its neighbors. FIG. 9 shows the case where the peak is centered between two transistor sites, yielding zero differential output signal. In this situation, the rightmost "B" transistor is shut off. Only the top two transistors carry any current.

Increasing the input signal still further moves the peak so that it coincides with the location of one of the "B" transistors, as shown in FIG. 10. Now the voltage on the emitter node 38 is highest and the output is negative. By increasing the differential voltage across the ends of the base resistor, the output signal has been driven from positive to zero to negative.

Figure 11:
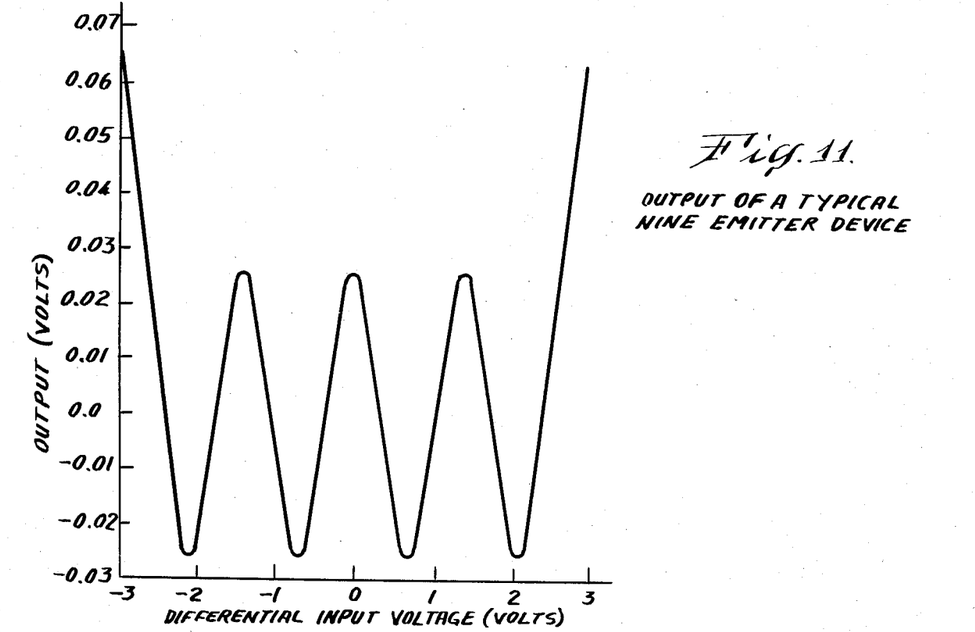
FIG. 11 is a simulated output response of a nine-emitter sub-converter.
Figure 12:
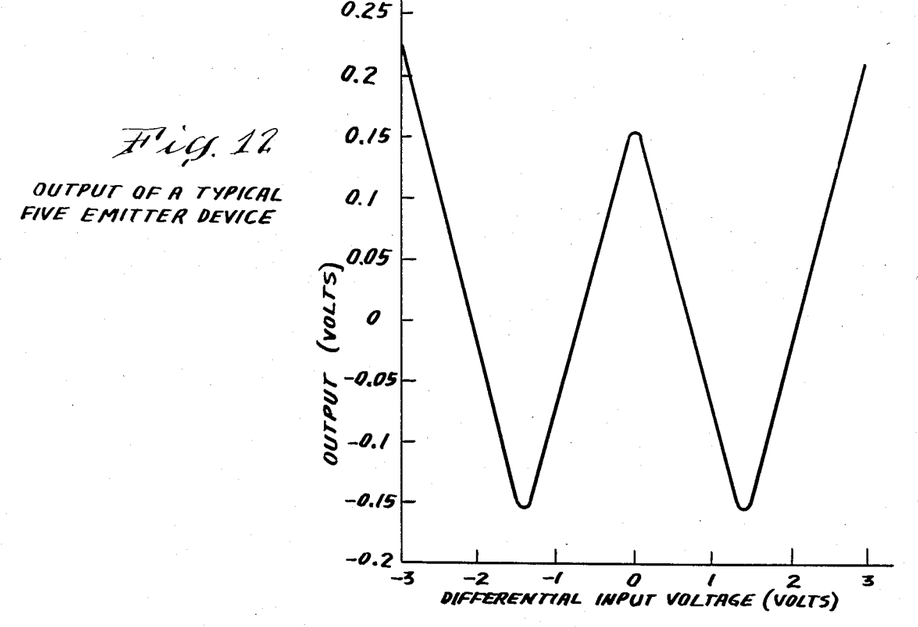
FIG. 12 is a simulated output response of a five-emitter sub-converter.

Thus, the voltage between output nodes 36 and 38 periodically reverses as the base potential peak is moved from one NPN location to the next. FIG. 11 is a typical plot of the resultant output signal versus input voltage. (Figures of this type may be referred to as "cross-plots".) The sign of this differential signal determines whether the Gray code bit at the output of the sub-converter will be a one or a zero. Since the example of FIG. 11 has eight zero crossings, it can be used for the LSB of a four-bit converter if sign of output indicates logic state. To generate the next highest order bit, five NPNs (instead of nine) are used, and the cross-plot of FIG. 12 is created.

Figure 13:
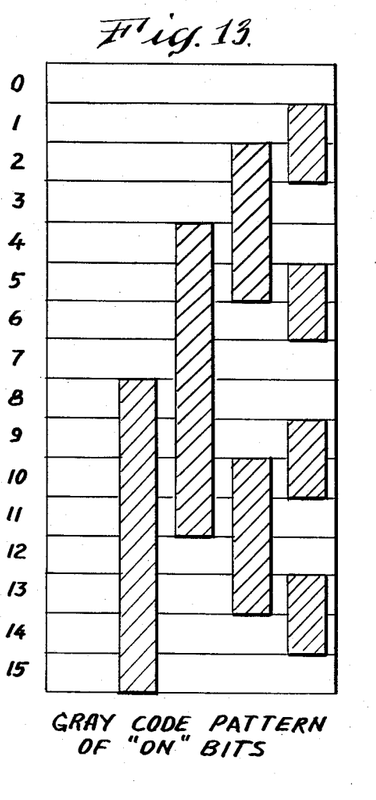
FIG. 13 presents a Gray code pattern of "on" bits.

The parabolic voltage distribution developed in a single base resistor 20 can be used for more than one set of emitters, i.e. for more than one bit of the output word. Thus, a plurality of emitter sets can be provided for the respective bits of the output, with each set having a different number of emitters. The MSB does not require any emitters, since it can be generated simply by evaluating the input signal with a comparator. This is evident from FIG. 13, which shows the pattern of "on" bits for a four-bit Gray code with the MSB shown as the left-most bit.

For the other bits, emitters must be located such that when the input voltage is at a bit transition point ($V_{out}=0$), the peak of the base voltage is at a point midway between two emitters. At this midway point, the two nearest emitters have the same base voltage and hence the output signal is zero. In terms of parabola peak motion, emitters should be located halfway between bit transitions. Since the LSB has eight transitions, nine emitters are required. The next highest bit requires five emitters, and so forth.

Figure 14:
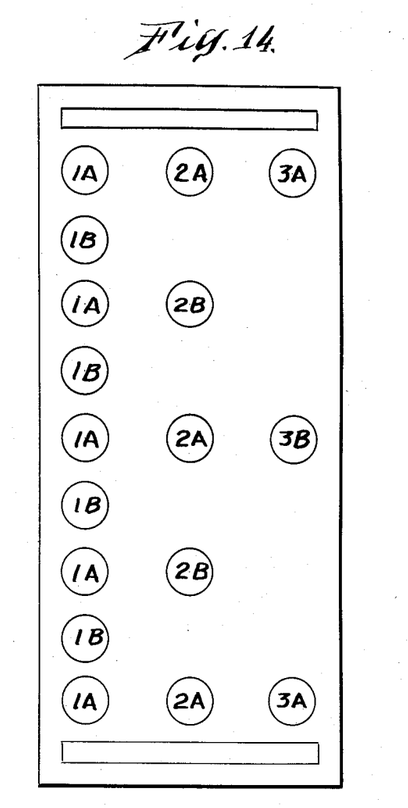
FIG. 14 shows a proposed emitter layout for a four-bit converter.
Figure 15:
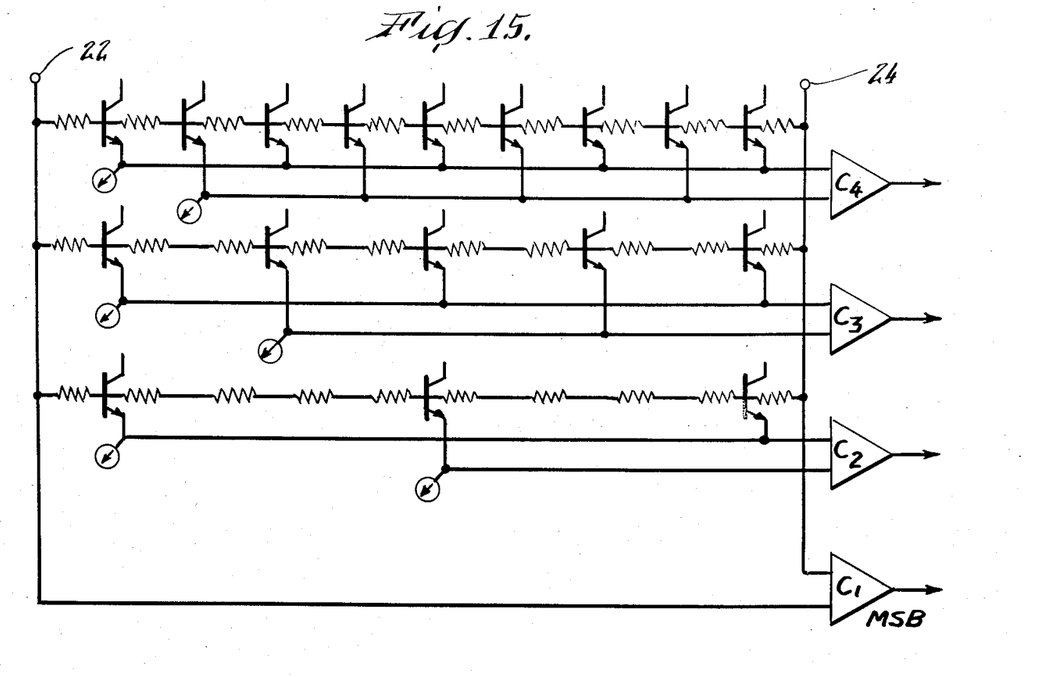
FIG. 15 is an equivalent-circuit diagram of a four-bit converter.

This can be achieved with an emitter layout as shown in FIG. 14. All of the emitters marked "A" in a single row are wired together and all of the emitters marked "B" in a single row are wired together, forming a pair of output nodes for each bit. This can be described as connecting the emitters to the output nodes in alternating anti-phase. An equivalent circuit diagram of a four-bit converter including comparators is illustrated in FIG. 15.

A separate current source is required for each emitter-controlled output node, making a total of 6 for the four-bit converter. One comparator is required for each bit. The Gray code of FIG. 2 will be generated as the input voltage range is scanned.

Figure 16:
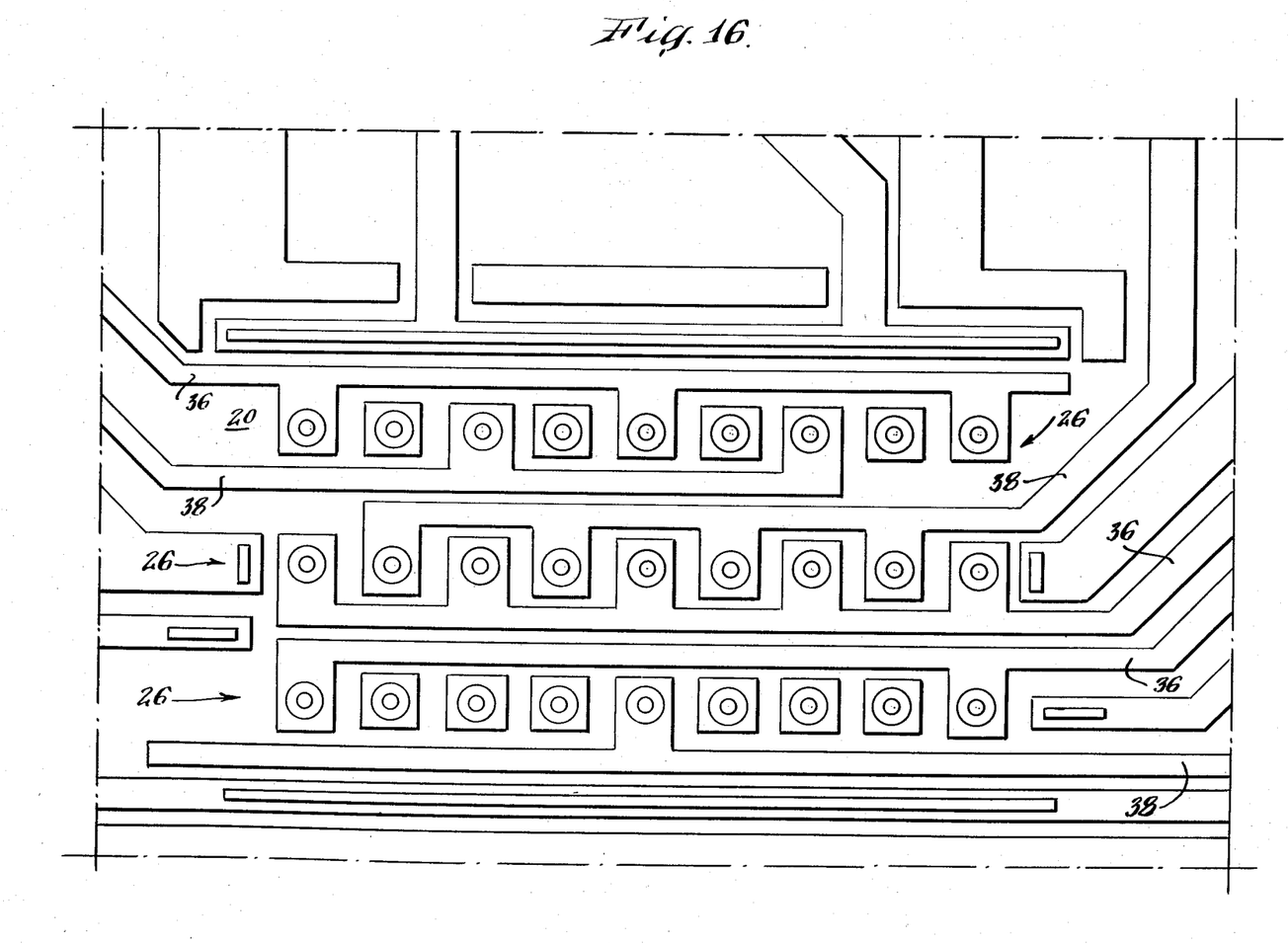
FIG. 16 is a pictorial presentation of the layout of a four-bit converter.

Advantageously, all three rows (referring to FIG. 14) may be provided with the same number of emitters, omitting connections to those emitters not required for the particular bit of the code to be generated. A pictorial presentation of such an arrangement is shown in FIG. 16.

Reviewing the elements of the disclosed converter, it will be seen to comprise an integrated-circuit chip having a semiconductive region within which a predetermined electrical distribution pattern is established, and wherein the pattern has a distinctive characteristic the position of which is shiftable within the region in response to changes in the analog input signal. Referring specifically to the disclosed embodiment, such semiconductive region is formed as an elongate base diffusion 20, and the predetermined electrical pattern is formed as a parabolic spatial voltage distribution along the line of the base diffusion. The distinctive characteristic of the electrical pattern is, in this case, the peak of the parabolic distribution along the base diffusion. The position of this characteristic peak is sensed by the array of emitters diffused in the base. These emitters are interconnected with the output nodes so that the output binary bit has a value (0/1) determined by the position of the parabolic peak along the base diffusion, as controlled by the analog input signal.

It will be clear that various implementations of this basic concept can be used. Also, considerably different semiconductive structures could be employed, with various means used for sensing the position of the peak or other distinctive characteristic controlled by the analog input signal. In that regard, a class of devices referred to as carrier domain devices (CDDs) can be used to carry out the invention.

The disclosed implementation has a number of advantages. For one, the output signal is available at the surface of the chip, rather than from the epi or buried layer. Thus the epi and the buried layer are not critical elements. Also, LPNPs can be used for bias current generation without concern for the flow of their base currents, and devices for more than one bit can be integrated together in a single isolation well without crosstalk.

Although a specific preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

What is claimed is:

1. An analog-to-digital converter including an integrated circuit chip providing at least one subconverter for developing one bit of a desired digital output word, said sub-converter comprising:
    a conductive region;
    means for establishing in said region a predetermined spatial electrical distribution pattern having a distinctive characteristic at one location of said region;
    means for applying an analog input signal to said region to alter said electrical distribution pattern correspondingly so as to shift the location of said characteristic as a function of said input signal; and
    means responsive to the position of said characteristic in said region for establishing an output binary bit having a value indicative of said position as controlled by said analog input signal.

2. A converter as claimed in claim 1, wherein said electrical distribution pattern is a voltage distribution pattern.

3. A converter as claimed in claim 1, wherein said distribution pattern is developed as a spatial voltage distribution along a line through said region.

4. A converter as claimed in claim 3, wherein said distinctive characteristic is a voltage extreme.

5. A converter as claimed in claim 4, wherein said distribution pattern is in the form of a parabola;
    the position of the voltage peak of said parabola being controllable by said analog input signal.

6. A converter as claimed in claim 5, wherein said region is a semi-conductive region formed as an elongate diffusion;
    said parabola being developed by directing current flow laterally into at least one side of said elongate diffusion.

7. A converter as claimed in claim 1, wherein said region is a semi-conductive region and said responsive means comprises a plurality of junctions associated with said region and responsive to said distinctive electrical characteristic as it moves through said region.

8. A converter as claimed in claim 7, wherein said semiconductive region comprises an elongate diffusion with said junctions being spaced along the length thereof.

9. A converter as claimed in claim 8, wherein said elongate diffusion is a base diffusion;
    said spaced junctions forming transistors with said base diffusion.

10. A converter as claimed in claim 9, including a pair of output nodes;
    the electrodes of said spaced junctions being connected to said output nodes in alternating antiphase.

11. A converter as claimed in claim 10, wherein said base diffusions forms a base bias network providing a plurality of series-connected resistors with separate nodes for said junctions.

12. A converter as claimed in claim 8, wherein said elongate diffusion is P-type;
    said responsive means comprising emitters spaced along said diffusion forming NPN transistors.

13. A converter as claimed in claim 12, including at least one additional P-type diffusion alongside said elongate diffusion to inject current into said elongate diffusion to form a parabolic voltage distribution therealong; and
    analog input terminals at the ends of said elongate diffusion.

14. A converter as claimed in claim 1, comprising a plurality of sub-converters formed on said IC chip.

15. A converter as claimed in claim 14, wherein all of said sub-converters are formed in a single isolation well of said chip.

16. A converter as claimed in claim 14, wherein said chip includes a single conductive region in the form of an elongate diffusion in which said electrical distribution pattern is formed;
    the responsive means of each of said subconverters being responsive to the position of said distinctive characteristic in said elongate region.

17. A converter as claimed in claim 16, wherein each of said responsive means comprises a row of junctions associated with said conductive region.

* * * * *